United States Patent
Reichmanis et al.

(10) Patent No.: US 7,309,876 B2
(45) Date of Patent: Dec. 18, 2007

(54) ORGANIC SEMICONDUCTOR HAVING POLYMERIC AND NONPOLYMERIC CONSTITUENTS

(75) Inventors: Elsa Reichmanis, Westfield, NJ (US); Oleksander Sydorenko, Painted Post, NY (US); Subramanian Vaidyanathan, Piscataway, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/362,671

(22) Filed: Feb. 27, 2006

(65) Prior Publication Data

US 2007/0158646 A1 Jul. 12, 2007

Related U.S. Application Data

(63) Continuation-in-part of application No. 11/323,947, filed on Dec. 30, 2005, now abandoned.

(51) Int. Cl.
*H01L 29/08* (2006.01)

(52) U.S. Cl. .................... 257/40; 257/20; 257/24; 257/191; 257/192; 361/527; 438/99

(58) Field of Classification Search .............. 257/40, 257/192, 62.3 Q; 438/82, 99; 136/263; 313/504; 528/422; 427/58; 361/527
See application file for complete search history.

(56) References Cited

U.S. PATENT DOCUMENTS

| | | | | |
|---|---|---|---|---|
| 5,500,537 | A * | 3/1996 | Tsumura et al. | 257/40 |
| 6,433,270 | B1 * | 8/2002 | Rack | 136/263 |
| 2002/0031602 | A1 * | 3/2002 | Zhang | 427/58 |
| 2003/0013843 | A1 * | 1/2003 | Pei | 528/422 |
| 2003/0062536 | A1 * | 4/2003 | Heeney et al. | 257/183.1 |
| 2003/0226996 | A1 * | 12/2003 | Aramaki et al. | 252/62.3 Q |
| 2004/0241900 | A1 * | 12/2004 | Tsukamoto et al. | 438/82 |
| 2004/0248338 | A1 * | 12/2004 | Sirringhaus et al. | 438/99 |

OTHER PUBLICATIONS

Lay-Lay Chua, et al.; "General observation of n-type field-effect behaviour in organic semiconductors"; Nature/vol. 434/Mar. 10, 2005/www.nature.com/nature; pp. 194-199.

Nandita Madhavan; "Small-Molecule Organic Semiconductors"; Apr. 1, 2002; http://www.scs.uiuc.edu/chem/gradprogram/chem435/s02-Madhavan.pdf; Organic Chemistry Seminar Abstracts 2001-2002 Semester II, University of Illinois at Urbana Champaign, 2002, pp. 49-56.

(Continued)

*Primary Examiner*—Jerome Jackson
*Assistant Examiner*—Jami Valentine

(57) ABSTRACT

A composition, comprising organic polymer molecules, and organic nonpolymeric molecules, wherein the composition is a semiconducting solid. The composition includes a distribution of crystal domains of the polymer molecules and inter-domain regions between the crystal domains, a concentration of polymer molecules being higher in the crystal domains than in the inter-domain regions, and a concentration of nonpolymeric molecules being higher in the inter-domain regions than in the crystal domains.

20 Claims, 4 Drawing Sheets

OTHER PUBLICATIONS

Paolo Coppo et al.; "Investigation of the electronic properties of cyclopentadithiophene polymers and copolymers"; Mat. Res. Soc. Symp. Proc. vol. 771; 2003 Materials Research Society; pp. L4.9.1-L4.9.4.

R.A. Street, et al.; "Transport in polycrystalline polymer thin-film transistors"; Physical Review B 71; 2005 The American Physical Society; pp. 165202-1-165202-13.

C.D. Dimitrakopoulos, et al.; "Organic thin-film transistors: A review of recent advances"; IBM J. Res. & Dev./vol. 45/No. 1/Jan. 1, 2001; pp. 11-27.

Parent case U.S. Appl. No. 11/323,947; filed on Dec. 30, 2005; entitled "Organic Semiconductor Having Polymeric and Nonpolymeric Constituents"; to Reichmanis, et al. currently pending.

* cited by examiner

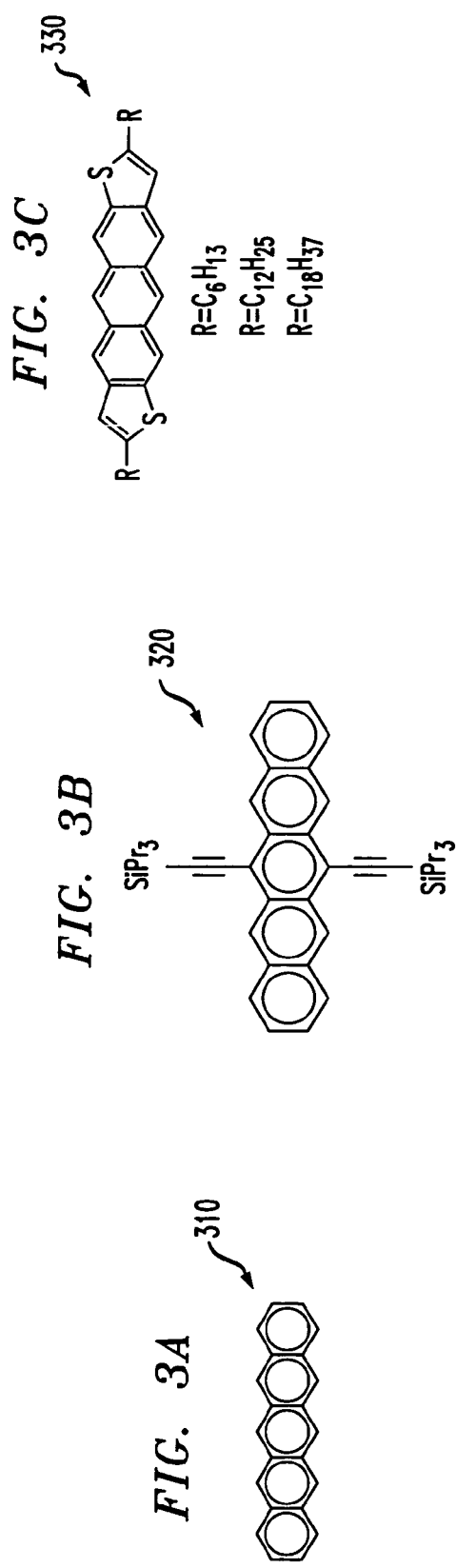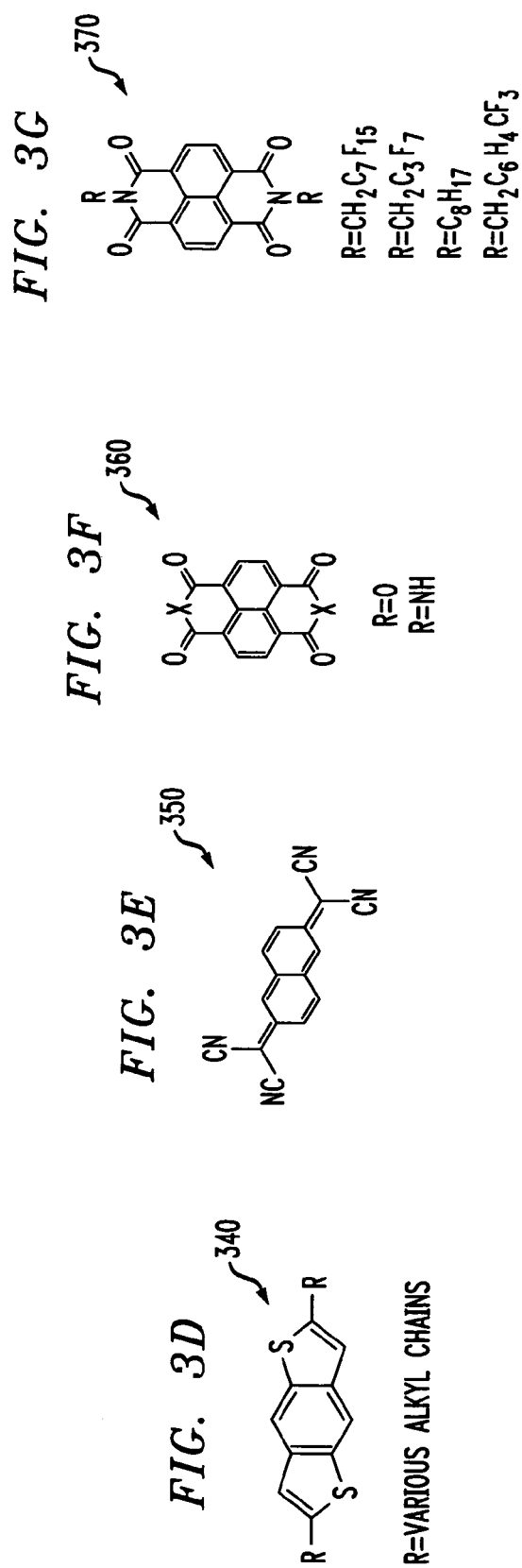

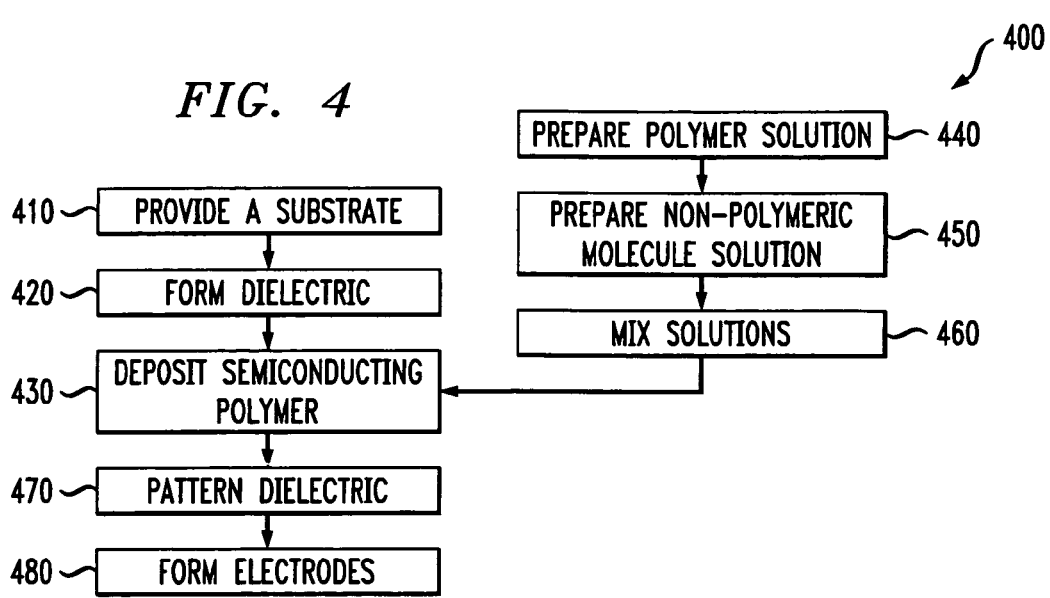
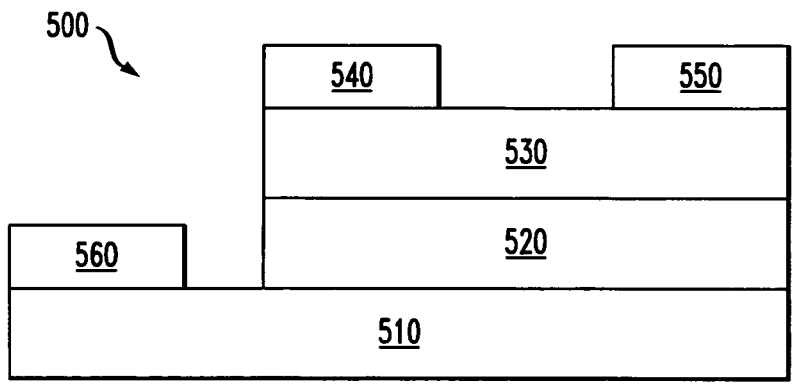
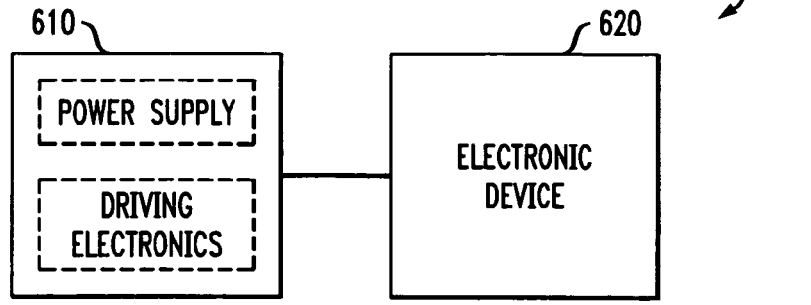

ORGANIC SEMICONDUCTOR HAVING POLYMERIC AND NONPOLYMERIC CONSTITUENTS

CROSS-REFERENCE TO RELATED APPLICATION

The present application is a continuation-in-part of U.S. patent application Ser. No. 11/323,947 by Reichmanis, et al., filed on Dec. 30, 2005 now abandoned, and incorporated herein by reference in its entirety.

TECHNICAL FIELD OF THE INVENTION

The present invention is directed, in general, to organic semiconductors and, more particularly, to organic semiconductor compositions suitable for use in oFETs.

BACKGROUND OF THE INVENTION

Organic semiconductors are the subject of intense research because of their potential for low-cost, flexible electronic devices. They have been employed in organic light-emitting diodes (oLEDs) and organic field-effect transistors (oFETs), and in circuits integrating multiple devices. Fabrication techniques such as ink-jet printing have helped reduce the cost of fabrication of these devices and integrated circuits using them.

Flexible electronics demand materials that meet mechanical requirements such as toughness and thermomechanical stability. However, some pure organic semiconducting materials with favorably high charge carrier mobility are relatively brittle in solid form, so the flexibility of a circuit using such materials may be limited. On the other hand, some materials with desirable mechanical properties may have unfavorably low charge carrier mobility. An organic semiconducting material is needed that combines the desirable properties of high carrier mobility, toughness and flexibility.

SUMMARY OF THE INVENTION

To address one or more of the above-discussed deficiencies, one embodiment is a composition. The composition comprises organic polymer molecules and organic nonpolymeric molecules, wherein the composition is a semiconducting solid.

Another embodiment is a method of fabricating a circuit. The method comprises forming an organic semiconductor channel over a substrate such that the channel comprises a mixture of semiconducting organic polymer molecules and semiconducting organic nonpolymeric molecules. A plurality of electrodes is formed over the substrate. The electrodes are located to function as a gate electrode, a drain electrode, and a source electrode of an FET, where the FET has an active channel formed by the organic semiconductor channel.

Yet another embodiment is an apparatus. The apparatus comprises an electronic device having an organic semiconductor channel with first and second electrodes in contact with the channel. The channel comprises a mixture of semiconducting organic polymer molecules and semiconducting organic nonpolymeric molecules.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIGS. 3A through 3G illustrate examples of nonpolymeric semiconducting molecules;

FIG. 4 is a method of forming an oFET using the composition comprising organic polymer molecules and organic nonpolymeric molecules;

FIG. 5 is a sectional view of an oFET comprising the composition; and

FIG. 6 illustrates an example apparatus.

DETAILED DESCRIPTION

One embodiment is a semiconducting solid composition comprising organic polymer molecules and organic nonpolymeric molecules. The polymer molecules and the nonpolymeric molecules are both characterized by having semiconducting properties in the solid phase. The majority charge carriers may be electrons or holes, depending on the nature of the molecules. If the majority carriers are electrons the composition is n-type and if the majority carriers are holes, the composition is p-type.

Those skilled in the art will appreciate that organic semiconductors can be separated into two broad classes based on their molecular weight. The first of these classes is polymers having a molecular weight of about 1500 g/mol or greater and incorporating aromatic or heteroaromatic units, where the units may be fused to each other and/or linked to each other in a way that maintains conjugation. The second is monodisperse compounds with a molecular weight of less than 1500 g/mol with a structure incorporating aromatic or heteroaromatic units where the units may be fused to each other and/or linked to each other in a way that maintains conjugation. As used herein, the term "polymer molecule" conforms to the first class definition, and "nonpolymeric molecule" conforms to the second. In one embodiment, the polymer molecule has a molecular weight of at least about 5,000 g/mol. In one embodiment, the nonpolymeric molecule has a molecular weight of about 750 g/mol or less. In a preferred embodiment, the polymer molecule has a molecular weight greater than about 15,000 g/mol, and the nonpolymeric molecule has a molecular weight of about 640 g/mol or less.

In one embodiment the organic polymer molecules form a plurality of crystal domains, and the organic nonpolymeric molecules are located between the crystal domains. The described morphology may be achieved by forming the composition using a solution of polymer molecules and nonpolymeric molecules in which the solubility of the polymer molecules is lower than the solubility of the non-polymeric molecules. The differential solubility allows polymer crystal domains to form first when the solvent is extracted. The nonpolymeric molecules, having a higher solubility, remain in solution longer. Thus, the nonpolymeric molecules leave the solvent after polymer molecules have partially formed crystal domains, and tend to be deposited in a manner that occupies the spaces between the crystal domains.

Figure 1:
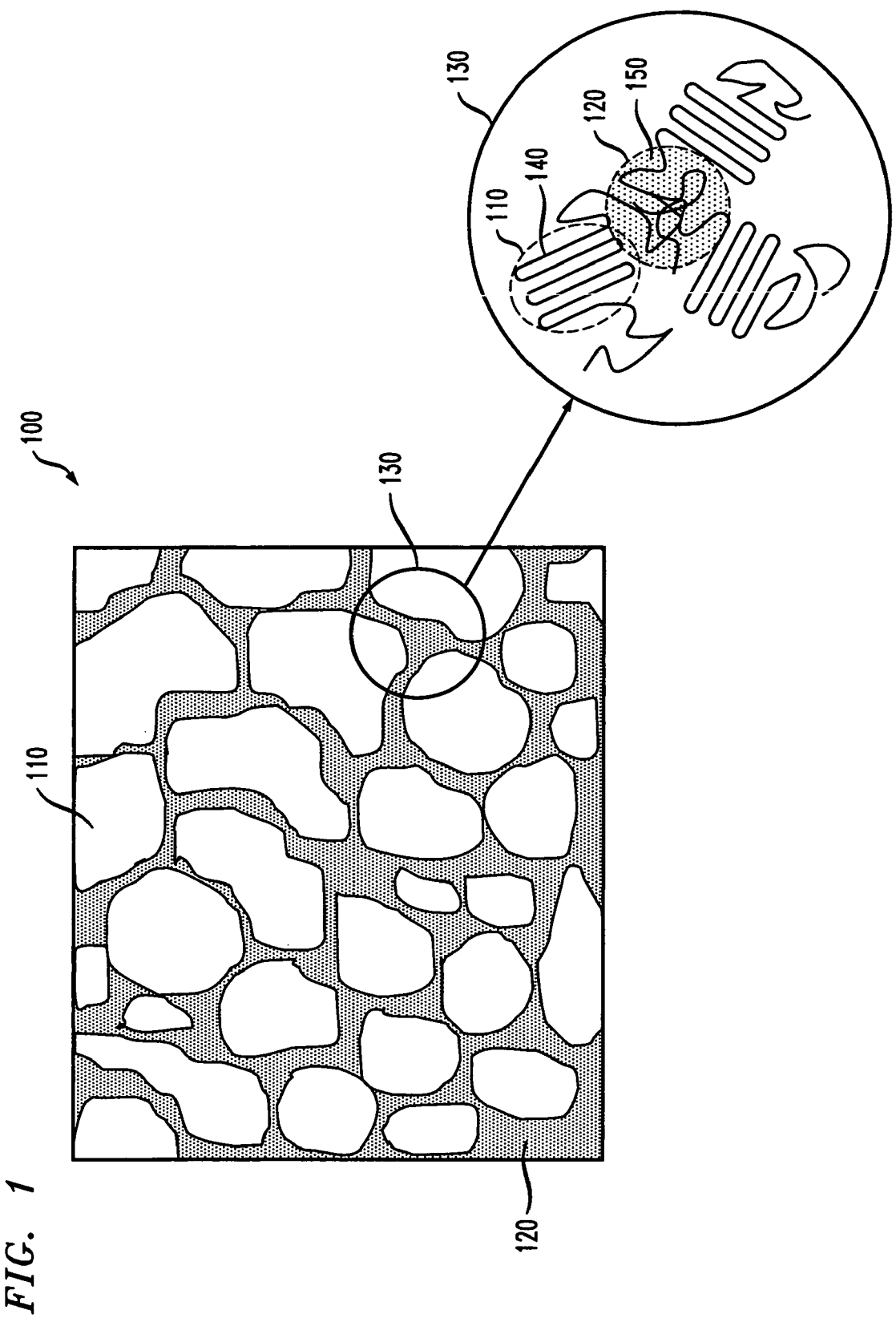
FIG. 1 presents a plan view of a composition including polymer molecules and nonpolymeric molecules.
Figure 2A:
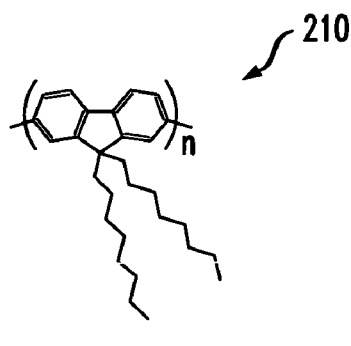
FIGS. 2A through 2E illustrate examples of semiconducting polymers.
Figure 2B:
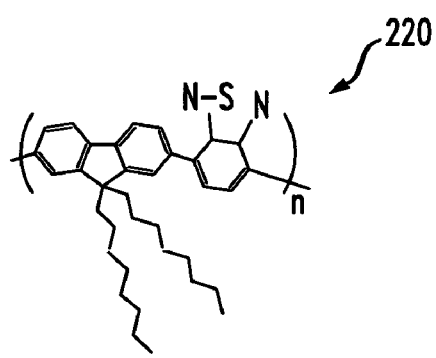
Figure 2C:
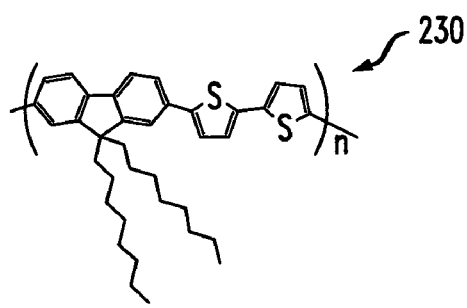
Figure 2D:
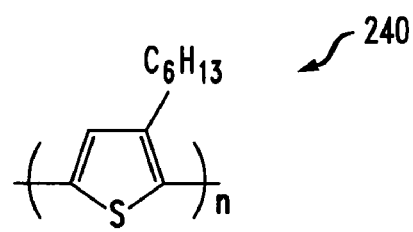
Figure 2E:
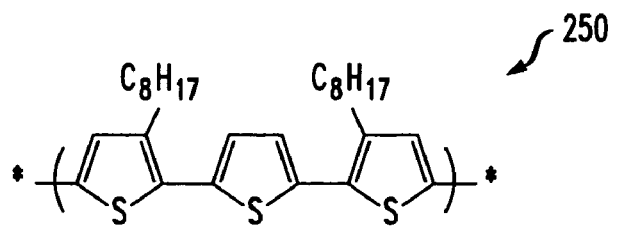

FIG. 1 presents a plan view of a composition 100 that comprises the polymer molecules and the nonpolymeric molecules. The polymer molecules are concentrated in crystal domains 110, and the nonpolymeric molecules, are concentrated in inter-domain regions 120. While the exemplary composition 100 is shown as a binary composition, a composition comprising more than two chemical constituents is also within the scope of the invention.

Those skilled in the pertinent arts will appreciate that in polycrystalline polymers, crystal domains may interact at their peripheries. Detail 130 illustrates an embodiment of the composition 100. Crystallites 140 may comprise crystalline portions of the polymer molecules. Inter-domain regions 120 may comprise nonpolymeric molecules and noncrystalline portions of the polymer molecules. The nonpolymeric molecules may be crystalline or partially crystalline. In this model, without limitation, crystal domains 110 may interact by entanglement of chains in the inter-domain regions 120.

Those skilled in the pertinent arts will recognize that the thermodynamics of crystallization may result in the substantial exclusion of nonpolymeric molecules from the crystallites 140. Thus, in an embodiment, the concentration of polymer molecules, which may be expressed, e.g., by weight percent or moles per unit volume, is higher in the crystal domains than in the inter-domain regions. However, an amount of the nonpolymeric molecules may be present in the crystal domains 110 without departing from the scope of the invention. The crystal domains 110 are expected to include typically less than about 20% by weight of the nonpolymer molecules and more typically less than about 5% by weight of the nonpolymer molecules. The crystal domains 110 may include less than about 1% by weight of the nonpolymeric molecules.

In an embodiment, the nonpolymeric molecules are present in a higher concentration in the inter-domain regions 120 than in the crystal domains 110. The concentration of nonpolymeric molecules may also be expressed, e.g., by weight percent or moles per unit volume. In FIG. 1 illustrates this embodiment, where nonpolymeric molecules 150 are shown in higher concentration in the inter-domain region 120 than in the crystallites 140. The inter-domain regions 120 may also comprise the noncrystalline portions of polymer chains. Thus, inter-domain regions 120 may be understood to include amorphous polymer molecules and crystalline or noncrystalline nonpolymeric molecules. The inter-domain regions 120 are expected to include typically more than about 50% by weight of the nonpolymeric molecules and more typically more than about 70% by weight of the nonpolymeric molecules. The inter-domain regions 120 may include more than about 90% by weight of the nonpolymeric molecules.

In a p-type material, it is preferable to match the highest occupied molecular orbital (HOMO) of the polymeric molecule to that of the nonpolymeric solid. In an n-type material, it is preferable to match the lowest unoccupied molecular orbital (LUMO) of the polymeric molecule to that of the nonpolymeric solid. By "matched," it is meant that the difference of energy between the HOMO or LUMO of the nonpolymeric molecule and the polymeric molecule is less than about 0.15 eV. In another aspect, the energy is matched when the energy of the HOMO or LUMO differs by less than about 5%.

It is believed that in a p-type semiconducting polymer, e.g., conductivity through the polymeric solid occurs primarily by hole conduction through overlapping π-orbitals of organic molecules therein. It is further believed that poor conduction occurs at the boundaries of the crystal domains 110 if there is poor overlap of π-orbitals at the boundaries.

It is further believed that inter-domain regions 120 between the polymer crystal domains 110 provide an alternate conductive path for majority charge carriers through the composition. Alternately, or in combination, the inter-domain regions 120 may improve coupling between crystal domains 110, thus "bridging the gap" between crystal domains 110 and allowing current to flow. It is believed that by matching the HOMOs of the polymer and nonpolymeric molecules, charge trapping at an interface between crystal domains 110 and inter-domain regions 120 may be reduced. Furthermore, reduction of such charge trapping may result in greater mobility of majority carriers in the composition 100 than would be the case with greater charge trapping.

The mechanical properties of the composition are dominated by the polymeric regions of the composition. Thus, mobility may be improved while substantially retaining desirable mechanical properties, such as thermal-mechanical stability and flexibility.

The distribution of polymer molecules in the composition is substantially uniform on the scale of device feature sizes, but is often not substantially uniform on a "nanoscale" level. Those skilled in the art appreciate that "nanoscale" features are those features with a size ranging from about 1 nm to less than about 1 μm. As used herein, the term "nanostructure" refers to the distribution of structural features at a nanoscale level. Typical feature sizes associated with oFETs are on the scale of multiple microns. As used herein, a uniform distribution of polymer molecules or nonpolymeric molecules in a composition means that nanoscale features are substantially uniformly distributed within the composition. Thus, for example, the composition 100 shown in FIG. 1 is uniform when the crystal domains 110 are nanoscale features, but a composition with distinct layers of polymer and nonpolymer would not be uniform.

In the crystal domains 110, the polymer may be one of the class of known semiconducting polymers. Numerous semiconducting polymers in this class are known. See, e.g., LL Chua, et al., Nature, Mar. 10, 2005, pp 194-98, Vol. 434, incorporated by reference herein in its entirety. The semiconducting polymers are distinguished by electron delocalization over conjugated π-orbitals, and the ability of electrons to "hop" between chains of neighboring semiconducting polymer molecules in the solid phase. The semiconducting polymers may be homopolymers or copolymers and may comprise cyclic or heterocyclic structures and their derivatives Examples include, but are not limited to, bithiophene, fluorene, and benzothiadiazole. Examples of substitutions on these molecules that may also produce semiconducting polymers include, but are not limited to, the addition of alkyl groups, alkoxy groups, ethers, and/or hydroxyl groups.

The nonpolymeric molecules of the inter-grain regions 120 may be semiconducting nonpolymeric molecules known in the art. Numerous nonpolymers in this class are also known. FIGS. 3A-3G show examples of such nonpolymeric molecules. The examples include: processable derivatives of pentacene 310, such as 6,13-bis (triisopropylsilylethynyl) pentacene (TIPS) 320; processable derivatives of anthradithiophene 330 and benzodithiophene 340; tetracyanoquinodimethane 350, naphthalene-1,4,5,8-tetracarboxyl di-anhydride 360, and N-substituted naphthalene-1,4,5,8-tetracarboxylic di-imides 370, and their derivatives.

The nonpolymeric molecules may be semiconducting nonpolymeric molecules known in the art. Numerous nonpolymers in this class are also known. See, e.g., N. Madhavan, Organic Chemistry Seminar Abstracts 2001-2002 Semester II, University of Illinois at Urbana Champaign, 2002, pp. 49-56, at http://www.scs.uiuc.edu/chem/gradprogram/chem435/s02-Madhavan.pdf, incorporated by reference herein in its entirety. FIGS. 3A-3G show examples of such nonpolymeric molecules. The examples include: processable derivatives of pentacene 310, such as 6,13-bis (triisopropylsilylethynyl) pentacene (TIPS) 320; processable derivatives of anthradithiophene 330 and benzodithiophene 340; tetracyanoquinodimethane 350, naphthalene-1,4,5,8-tetracarboxyl di-anhydride 360, and N-substituted naphthalene-1,4,5,8-tetracarboxylic di-imides 370, and their derivatives. Those skilled in the chemical arts will recognize that this set of example nonpolymeric molecules falls within the second class of organic semiconductors described previously, and that the set is not exhaustive.

In one embodiment, the mobility of the charge carriers in the nonpolymeric solid is greater than the carrier mobility of the polymer solid. Furthermore, in this embodiment the carrier mobility in the composition is greater than that of the pure polymer molecule, while the composition has toughness, flexibility and thermomechanical stability that are substantially similar to the pure polymer. Thus, the carrier mobility is increased without substantial degradation of mechanical properties.

In one embodiment, the composition comprises between about 30% and about 50% of nonpolymeric molecules by weight. Those skilled in the chemical arts will appreciate that as the composition is made more pure with respect to the polymeric molecule or the nonpolymeric molecule, the properties of the composition will approach those of the pure constituent. Conversely, advantageous properties of the composition may be realized within one or more ranges of concentration of one constituent within the other. In a preferred embodiment, the composition comprises about 30% nonpolymeric molecule by weight.

In one embodiment, the polymer molecule is F8T2 230. The solid phase of F8T2 230 may have an intrinsic hole mobility of about 1e-4 $cm^2 \cdot V^{-1} \cdot s^{-1}$. In one aspect, F8T2 230 with a molecular weight of at least about 15,000 g/mol is used.

In another embodiment, the nonpolymeric molecule is TIPS 320, with a molecular weight of about 638 g/mol. TIPS 320 is a p-type semiconductor with a typical carrier mobility of about 0.01 $cm^2 \cdot V^{-1} \cdot s^{-1}$ when deposited from solution.

In another embodiment, the nonpolymeric organic chemical constituent may be a processable derivative of a heterocyclic polyconjugated compound such as, for example, anthradithiophene 330 or benzodithiophene 340. While the hole mobility in such derivatives may be lower than TIPS 320, side-chain modification of these compounds may improve stability and processability of the composition.

In one embodiment, the organic polymer molecules include F8T2 230 with a molecular weight of at least about 15,000 g/mol, and the nonpolymeric organic molecules include TIPS 320.

Another embodiment is a method of fabricating a circuit. The method comprises forming an organic semiconductor channel over a substrate so that the channel comprises a mixture of semiconducting organic polymer molecules and semiconducting organic nonpolymeric molecules. Electrodes are formed over the substrate, the electrodes being located to function as a gate electrode, a drain electrode, and a source electrode of an FET. The active channel of the FET comprises the organic semiconductor.

FIG. 4 illustrates a method 400 of fabricating a circuit. Those skilled in the art will appreciate that several architectures may be used to form an oFET, including bottom gate, top gate, and coplanar structures. For illustration purposes, the method 400 will be presented assuming a bottom gate oFET. It will be immediately apparent to those skilled in the art that the composition may be employed in alternate oFET architectures.

FIG. 5 illustrates a sectional view of a bottom-gate oFET 500. In the illustrated architecture, the bottom gate comprises a substrate 510 having sufficient conductivity to act as a gate. A dielectric 520 insulates semiconducting composition 530 from the substrate 510. A source electrode 540, drain electrode 550 and gate electrode 560 provide electrical connectivity to the terminals of the oFET 500.

In FIG. 4, step 410, the substrate 510 is provided upon which the circuit will be fabricated. A substrate 510 may be a $p^{++}$-silicon wafer or other suitable substrate. In a step 420, the dielectric 520 is conventionally formed over the substrate. The dielectric 520 may be a thermally grown $SiO_2$ layer, or other conventional dielectric.

In a step 430, the semiconducting composition 530 is formed on the dielectric 520. The semiconducting composition may be, e.g., the composition 100 of FIG. 1. The semiconducting composition 530 may be deposited from solution by dip-coating or spin-coating. In one embodiment, a polymeric molecule with a molecular weight greater than about 15,000 g/mol and a nonpolymeric molecule with a molecular weight less than about 640 g/mol are combined in the composition 530. In another embodiment, the polymer molecule is F8T2 230 and the nonpolymeric molecule is TIPS 320.

A multi-step process may be used to prepare the solution for dip-coating or spin-coating. In a step 440, the process includes dissolving the semiconducting polymer in a solvent. In an embodiment, the solubility of the polymer molecule in the solvent is less than that of the nonpolymeric molecule in the solvent. Formation of the semiconducting composition 530 using the method 400 causes polymer molecules to at least partially precipitate from the solvent before the nonpolymeric molecules. In this manner, the desired nanostructure as previously described with respect to FIG. 1 is achieved.

In an embodiment, the solvent is xylene, and the polymer is F8T2 230 which is available from American Dye Source Inc., Quebec, Canada. For example, in step 440, a solution with a concentration of about 5 g/L of F8T2 230 in xylene may be prepared at room temperature. In a step 450, the process includes preparing a solution of the nonpolymeric molecules. The solvent may again be xylene, and the nonpolymeric molecules may be TIPS 320. One synthesis of TIPS 320 is described by CA Landis, et al., Japanese Journal of Applied Physics Part 1, June 2005, pp. 3921-22, Vol. 44, which is incorporated by reference herein in its entirety. In step 450, a solution with a concentration of about 5 g/L of TIPS 320 in xylene may be prepared at room temperature. At a step 460, the process includes mixing the two solutions at a ratio of F8T2 solution to TIPS solution ranging from about 3:7 to about 1:1. The concentration of TIPS 320 in a composition formed using this ratio ranges from about 30% to about 50% by weight.

If dip-coating is used to deposit the solution onto the substrate, coating is done at room temperature without vapor confinement. A withdrawal rate of the substrate from the solution ranging from about 0.2 mm/s to about 5 mm/s may be used to produce a film ranging from about 70 nm to about 20 nm thickness.

Advantageously, the hole mobility of a composition prepared by the described method is about 1e-3 $cm^2 \cdot V^{-1} \cdot s^{-1}$ to about 3e-3 $cm^2 \cdot V^{-1} \cdot s^{-1}$, roughly a factor of 10 improvement over pure F8T2 230. The resulting composition also substantially retains the mechanical properties of the pure polymer.

In a step 470, the semiconducting composition 530 and dielectric 520 are patterned using conventional means to expose portions of the substrate 510. The source electrode 540, drain electrode 550 and gate electrode 560 are then conventionally formed over the substrate. Formation may be performed, e.g., by deposition of gold using a shadow mask.

Another embodiment is an apparatus. The apparatus comprises an electronic device having a first and a second electrode in contact with a channel comprising the composition described herein.

FIG. 6 shows an exemplary apparatus 600. Electronics 610 may comprise a power supply and driving electronics to interface to an electronic device 620. The electronic device 620 may be formed according to the method 400 described herein, and has a channel comprising the composition described herein. The electronic device 620 may comprise a gate electrode located to produce an electric field at the surface of the channel. The electronic device 620 may additionally be an oFET fabricated by the method 400.

Although the present invention has been described in detail, those skilled in the pertinent art should understand that they can make various changes, substitutions and alterations herein without departing from the spirit and scope of the invention in its broadest form.

What is claimed is:

1. A composition, comprising:
    organic polymer molecules, and
    organic nonpolymeric molecules,
    wherein the composition is a semiconducting solid and includes a distribution of crystal domains of the organic polymer molecules and inter-domain regions between the crystal domains that include the nonpolymeric molecules and amorphous portions of some of the organic polymer molecules included in the crystal domains, and at least one of the amorphous portions of the organic polymer molecules included in at least one of the crystal domains entangles with an amorphous portion of another of the organic polymer molecules in one of the inter-domain regions.

2. The composition of claim 1, wherein the crystal domains are at least about 80% by weight formed of the organic polymer molecules.

3. The composition of claim 1, wherein the wherein the inter-domain regions are at least about 50% by weight formed of the organic nonpolymeric molecules.

4. The composition of claim 1, wherein the organic polymer molecules have a molecular weight of at least about 5,000 g/mol.

5. The composition of claim 1, wherein the semiconductor layer comprises at least about 20% by weight of the organic nonpolymeric molecules.

6. The composition of claim 1, wherein a highest occupied molecular orbital (HOMO) energy of the organic polymer molecule differs from a HOMO energy of the organic nonpolymer molecule by about 5% or less.

7. A method of fabricating a circuit, comprising:
    forming an organic semiconductor channel over a substrate such that the channel comprises a mixture of semiconducting organic polymer molecules and semiconducting organic nonpolymeric molecules; and
    fabricating a plurality of electrodes over the substrate,
    wherein the electrodes are located to function as a gate electrode, a drain electrode, and a source electrode of an FET, the FET having an active channel formed by the organic semiconductor channel, and
    wherein the forming includes producing a semiconducting layer with a distribution of crystal domains of the organic polymer molecules and inter-domain regions between the crystal domains that include the nonpolymeric molecules and amorphous portions of some of the organic polymer molecules included in the crystal domains, and at least one of the amorphous portions of the organic polymer molecules included in at least one of the crystal domains entangles with an amorphous portion of another of the organic polymer molecules in one of the inter-domain regions.

8. The method of claim 7, wherein the crystal domains are at least about 80% by weight formed of the organic polymer molecules, and the inter-domain regions are at least about 50% by weight formed of the organic nonpolymeric molecules.

9. The method of claim 7, wherein the forming includes producing a semiconducting layer having semiconducting polymeric molecules with molecular weight of more than about 5,000 g/mol.

10. The method of claim 7, wherein the forming produces a layer comprising the polymer F8T2 and a pentacene derivative.

11. The method of claim 7, wherein the forming causes the polymer molecules to precipitate from a solvent before the nonpolymeric molecules precipitate from the solvent.

12. An apparatus, comprising
    an electronic device having an organic semiconductor channel, and first and second electrodes in contact with the channel,
    wherein the channel comprises a mixture of semiconducting organic polymer molecules and semiconducting organic nonpolymeric molecules, and
    wherein the channel has a distribution of crystal domains of the organic polymer molecules and inter-domain regions between the crystal domains that include the nonpolymeric molecules and amorphous portions of some of the organic polymer molecules included in the crystal domains, and at least one of the amorphous portions of the organic polymer molecules included in at least one of the crystal domains entangles with an amorphous portion of another of the organic polymer molecules in one of the inter-domain regions.

13. The apparatus of claim 12, wherein the device is an FET.

14. The apparatus of claim 12, wherein the crystal domains are at least about 80% by weight formed of the organic polymer molecules, and the inter-domain regions are at least about 50% by weight formed of the organic nonpolymeric molecules.

15. The apparatus of claim 12, wherein the polymer molecules have a molecular weight of more than about 5,000 g/mol.

16. The apparatus of claim 12, wherein the polymer molecules include F8T2.

17. The apparatus of claim 12, wherein the nonpolymeric molecules include a pentacene derivative.

18. The composition of claim 1, wherein the amorphous portion of another of the organic polymer molecules is a portion of one of the organic polymer molecules included in another of the crystal domains.

19. The method of claim 7, wherein the amorphous portion of another of the organic polymer molecules is a portion of one of the organic polymer molecules included in another of the crystal domains.

20. The apparatus of claim 12, wherein the amorphous portion of another of the organic polymer molecules is a portion of one of the organic polymer molecules included in another of the crystal domains.

* * * * *